United States Patent [19]

Kitano et al.

[11] Patent Number: 4,601,014

[45] Date of Patent: Jul. 15, 1986

[54] SEMICONDUCTOR MEMORY WITH WORD LINE CHARGE ABSORBING CIRCUIT

[75] Inventors: Kouichi Kitano, Tokyo; Hideaki Isogai, Higashikurume, both of Japan

[73] Assignee: Fujitsu Limited, Kawasaki, Japan

[21] Appl. No.: 476,263

[22] Filed: Mar. 17, 1983

[30] Foreign Application Priority Data

Mar. 19, 1982 [JP] Japan ............................ 57-43978
Sep. 27, 1982 [JP] Japan ............................ 57-166711

[51] Int. Cl.[4] ..................... G11C 11/40; G11C 7/00
[52] U.S. Cl. ............................... 365/155; 365/230; 365/242; 365/190
[58] Field of Search ............... 365/189, 190, 203, 204, 365/242, 174, 230, 155, 179

[56] References Cited

U.S. PATENT DOCUMENTS

| | | | |
|---|---|---|---|
| 4,370,736 | 1/1983 | Takahashi | 365/190 |
| 4,393,476 | 7/1983 | Ong | 365/189 |
| 4,477,885 | 10/1984 | Sharp | 365/242 |
| 4,488,263 | 12/1984 | Herndon et al. | 365/230 |

FOREIGN PATENT DOCUMENTS

| | | | |
|---|---|---|---|
| 0149531 | 11/1979 | Japan | 365/189 |
| 0124194 | 9/1981 | Japan | 365/230 |
| 0088591 | 6/1982 | Japan | 365/174 |

*Primary Examiner*—James W. Moffitt
*Assistant Examiner*—Glenn A. Gossage
*Attorney, Agent, or Firm*—Staas & Halsey

[57] ABSTRACT

A semiconductor memory circuit including a charge absorbing circuit. The charge absorbing circuit absorbs at least a current induced by a voltage increase in the word line occurring soon after the word line is switched from a selection state to a nonselection state.

8 Claims, 14 Drawing Figures

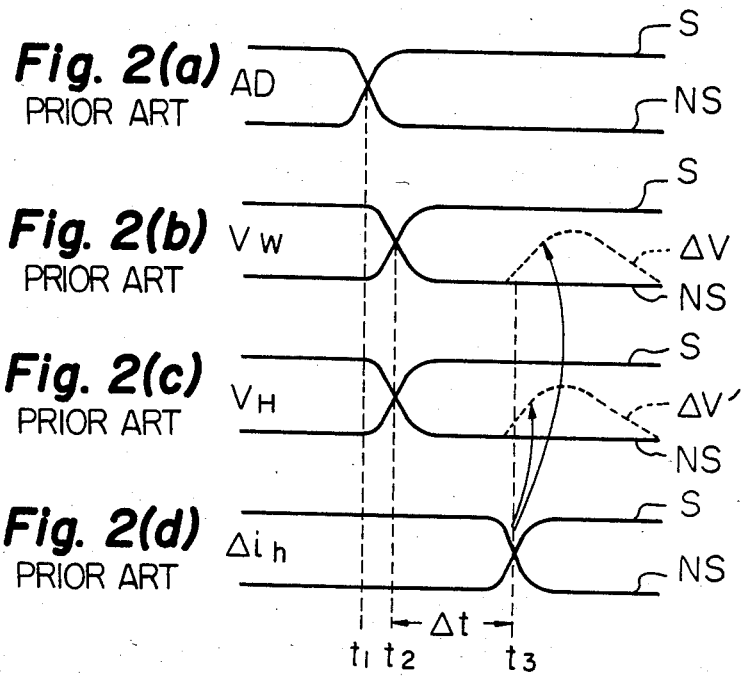
Fig. 2(a) PRIOR ART AD
Fig. 2(b) PRIOR ART $V_W$
Fig. 2(c) PRIOR ART $V_H$
Fig. 2(d) PRIOR ART $\Delta i_h$
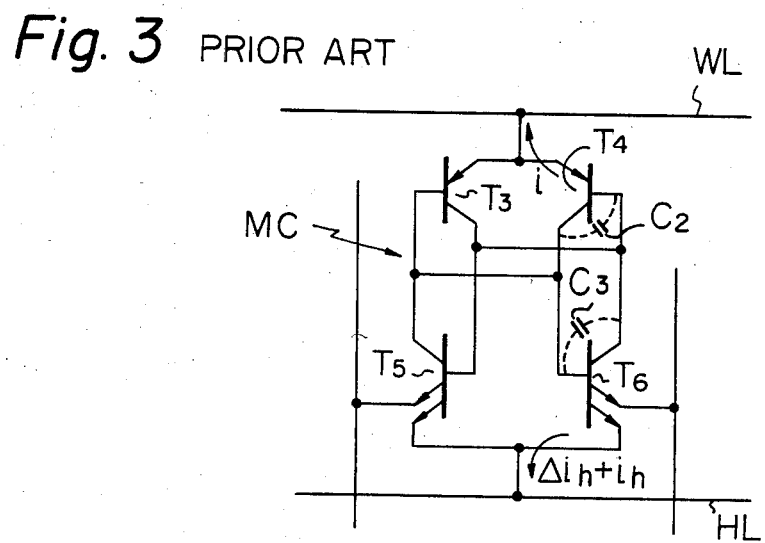
Fig. 3 PRIOR ART

SEMICONDUCTOR MEMORY WITH WORD LINE CHARGE ABSORBING CIRCUIT

BACKGROUND OF THE INVENTION

1. Field of the Invention

The present invention relates to a semiconductor memory circuit, and more particularly, to a static-type semiconductor memory circuit comprising saturation-type memory cells and incorporating delay circuits therein.

2. Description of the Prior Art

In recent years, a variety of semiconductor memory circuits have been proposed. The present invention especially refers to the static-type semiconductor memory circuit comprising saturation-type semiconductor memory cells and incorporating delay circuits therein. The delay circuits are connected to word lines to improve both the rising and falling characteristics of the word lines and of the hold lines. The presence of such delay circuits makes it possible to achieve high speed transition of the word lines from a selection state to a non-selection state and vice versa. This results in a very short access time for the memory cells. Further, such time delay circuits provide an advantage in that the short access time is obtained without increasing the memory cell current, that is, without increasing the power consumption. However, there is a problem with the such delay circuits in that an undesired double selection of word lines tends to often occur.

SUMMARY OF THE INVENTION

It is an object of the present invention to overcome the problem of double selection of word lines.

The above object is attained by a charge absorbing circuit for each pair of word lines and hold lines. The charge absorbing circuit can absorb charges induced by the increase in the voltage level of each pair of word lines which occurs after completion of a transition from a selection state to a nonselection state of the word line concerned.

BRIEF DESCRIPTION OF THE DRAWINGS

The present invention will be more apparent from the ensuing description with reference to the accompanying drawings, wherein:

FIGS. 2(a)-2(d) depict waveforms of signals appearing in the circuit of FIG. 1;

FIG. 3 is a circuit diagram of a typical saturation-type memory cell;

DESCRIPTION OF THE PREFERRED EMBODIMENTS

Figure 1:
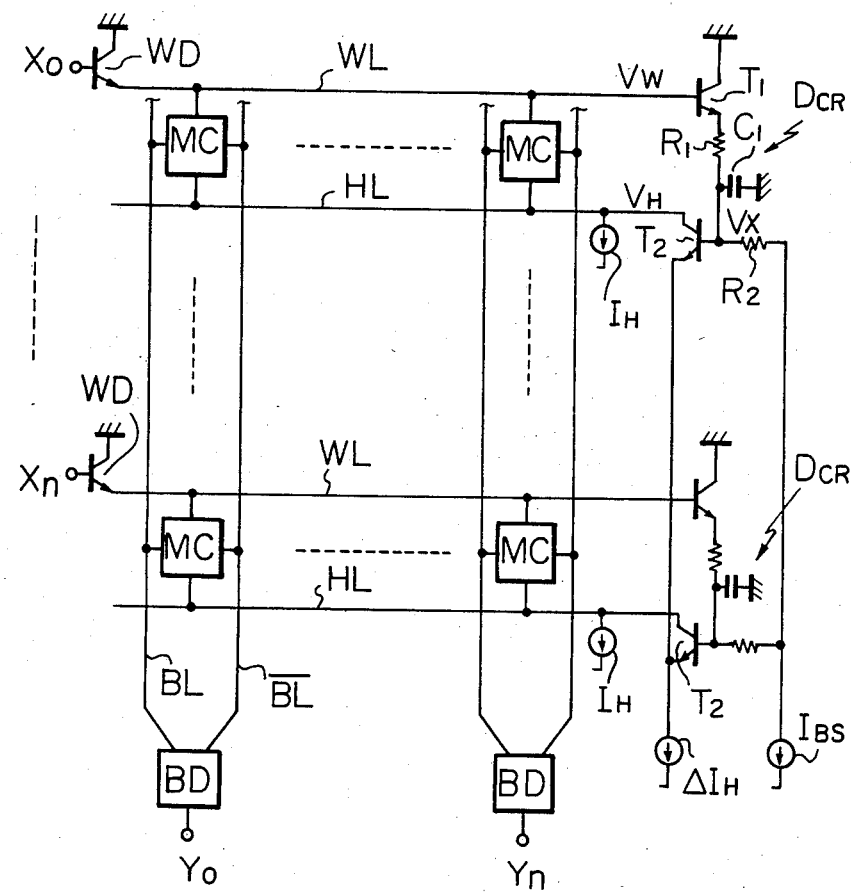
FIG. 1 is a circuit diagram of a static-type semiconductor memory circuit to which the present invention is adapted.

FIG. 1 is a circuit diagram of a static-type semiconductor memory circuit to which the present invention is adapted. In FIG. 1, the symbol MC corresponds to a memory cell; WL to a word line; HL to a hold line; BL and $\overline{BL}$ to a pair of bit lines; WD to a word driver; BD to a bit line driver; $I_H$ to a hold current source; and $D_{CR}$ to a delay circuit. The delay circuits $D_{CR}$ exist for word lines WL. Each delay circuit $D_{CR}$ comprises: a first transistor $T_1$ which detects the voltage level change of the word line; a first resistor $R_1$ and a first capacitor $C_1$, together comprising a time constant circuit; and a second transistor $T_2$ which receives, at its base, the output from the time constant circuit ($C_1$, $R_1$). Each second transistor is connected, at its collector, to the hold line HL and, at its emitter, to a common additional hold current source $\Delta I_H$. The second transistors $T_2$ are commonly connected, at their emitters, to the current source $\Delta I_H$. Thereby, a so-called current switch is formed. Also, the second transistors $T_2$ are commonly connected, at their bases, to a common bias current source $I_{BS}$, through second resistors $R_2$.

A detailed explanation of the operation of the delay circuit $D_{CR}$ is mentioned in the specification of U.S. Pat. No. 4,370,736, so only a brief explanation is given here. Only one of the many second transistors $T_2$, forming part of the previously mentioned current switch, is turned on when that transistor $T_2$ has the highest base voltage level among the base voltage levels of the transistors $T_2$. Therefore, an additional hold current is absorbed by the source $\Delta I_H$ through the transistor $T_2$ which is conductive. In this case, the base voltage level $V_X$ of the conducting transistor $T_2$ changes after the change of the voltage level $V_W$ of the word line WL with a predetermined time delay. Therefore, the second transistor $T_2$ is turned on not immediately after the voltage change of the word line WL, but with the above-mentioned time delay.

FIGS. 2(a)-2(d) depict waveforms of signals appearing in the circuit of FIG. 1. FIG. 2(a) represents a change of address selection signal indicated as $X_0$ through $X_n$ in FIG. 1. The address change occurs at time t1. FIG. 2(b) represents a change of the word line voltage level $V_W$, which occurs at time t2 close to t1. FIG. 2(c) represents a change of the hold line voltage level $V_H$, which follows immediately after the time t2. FIG. 2(d) represents a change of the additional hold current $\Delta i_h$ absorbed by the additional hold current source $\Delta I_H$ flowing through the conductive second transistor $T_2$, which occurs at time t3 with a delay time of $\Delta t$ after the time t2 due to the presence of the time constant circuit. In FIGS. 2(a) through 2(d), the symbol "S" indicates a selection state and "NS" a nonselection state.

Thus, the additional hold current $\Delta i_h$ does not start flowing through the hold line HL until the word line voltage level $V_W$ rises to its saturation level. This means that the word line is allowed to carry a relatively light load during the transition from the nonselection state to the selection state. On the other hand, during the transition from the selection state to the nonselection state, the additional hold current $\Delta i_h$ continues flowing through the hold line for a while ($\Delta t$) even after the word driver WD stops supplying a current due to the address change. Consequently, the change of the word line voltage level, that is, the transition from the selection state to the nonselection state and vice versa, is completed very quickly. In addition, referring especially to the transition from the selection state to the nonselection state, the current $\Delta i_h$ is also stopped very quickly. This is because the current $\Delta i_h$ is produced by the current switch comprising the second transistor $T_2$ and the current source $\Delta I_H$, which current switch usually operates with a high gain. However, it is very important to note that such a quick stoppage of the current $\Delta i_h$ induces an undesired increase in the word line voltage (also the hold line voltage), shown as $\Delta V$ and $\Delta V'$ by broken lines in FIGS. 2(b) and 2(c). Such undesired voltage increases $\Delta V$ and $\Delta V'$ result in double selection of the word lines.

The reason why such voltage increases $\Delta V$ and $\Delta V'$ are generated is not clearly understood, but is considered, in reference to FIGS. 2 and 3, to be as follows: FIG. 3 is a circuit diagram of a typical saturation-type memory cell. In FIG. 3, members which are the same as those of FIG. 1 are represented by the same reference symbols (similarly for later figures). Reference symbols $T_3$ and $T_4$ represent load transistors of the pnp type. Reference symbols $T_5$ and $T_6$ represent driver transistors of the npn and multiemitter type. Assuming that the transistors of the transistor $T_6$ side are now conductive, the current $\Delta i_h$ for the current source $\Delta I_H$ of FIG. 1 and also the current $i_h$ for the current source $I_H$ of FIG. 1, i.e., $\Delta i_h + i_h$, flow in the memory cell MC into the hold line HL via the emitter and base of the transistor $T_4$ and the collector and emitter of the transistor $T_6$. At this time, charges are stored in a junction capacitor $C_2$ between the collector and base of the transistor $T_4$ and also in a junction capacitor $C_3$ between the collector and base of the transistor $T_6$. In this case, the junction capacitance of $C_2$ and the junction capacitance of $C_3$ are variable in accordance with the variation of the current as $\Delta i_h + i_h$. To be specific, if this current is large, each of the junction capacitances is also large and vice versa. Accordingly, when the quick stoppage of the current $\Delta i_h$ occurs due to the high gain of the current switch ($T_2$, $\Delta I_H$), the junction capacitances of $C_2$ and $C_3$ are simultaneously also quickly made small simultaneously. Therefore, these junction capacitors $C_2$ and $C_3$, which now have small junction capacitances, can no longer hold the charges that are stored therein, and surplus charges are produced therefrom. These surplus charges may, on one hand, fade away through recombination and, on the other hand, travel somewhere. The traveling surplus charges are represented by a current i of FIG. 3 flowing into the word line WL. The current i induces the increase in the word line voltage, as indicated by symbol $\Delta V$ in FIG. 2(b). At the same time, the increase $\Delta V$ induces an increased $\Delta V'$ in the hold line voltage via the memory cell MC, as shown in FIG. 2(c).

Even though the value of the current i itself is small, the value of the voltage increase $\Delta V$ (also $\Delta V'$) is relatively high. This is because the impedance of the word line WL itself is relatively high.

Thus, the voltage increase $\Delta V$ ($\Delta V'$) induces, in the worst case, undesired double selection between one word line which is going to be changed from the selection state to the nonselection state and another word line which is going to be changed from the nonselection state to the selection state. Even if such a worst case is not created, deterioration of the write operation characteristic may occur, because an undesired branching of the write current takes place in the two word lines interchanging the selection and nonselection states therebetween.

Figure 4:
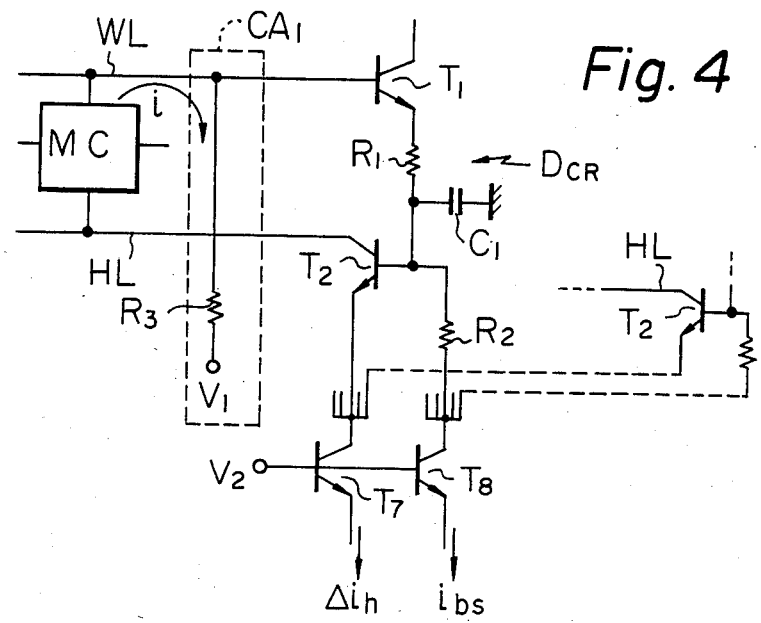
FIG. 4 is a circuit diagram of a part of the semiconductor memory circuit of FIG. 1 cooperating with a charge absorbing circuit according to a first embodiment of the present invention.

FIG. 4 is a circuit diagram of a part of the semiconductor memory circuit of FIG. 1 cooperating with a charge absorbing circuit according to a first embodiment of the present invention. The first embodiment is illustrated as a charge absorbing circuit $CA_1$ which is simply constructed by a third resistor $R_3$. The resistor $R_3$ is connected, at one end, to the word line WL, while it receives, at the other end, a first constant voltage $V_1$. The level of the voltage $V_1$ is set to the same voltage level as the word line appearing in the nonselection state. Accordingly, the current i, due to the traveling surplus charges, is absorbed by a voltage difference across the resistor $R_3$ identical to the voltage $\Delta V$. At the same time, the voltage increase $\Delta V$ can be suppressed by the discharge of the current i. In other words, the impedance of the word line WL is lowered by the resistor $R_3$.

Transistors $T_7$ and $T_8$ receive, at their bases, a second constant voltage $V_2$ so as to form the common additional hold current source $\Delta I_H$ producing the current $\Delta i_h$ and the common bias current source $I_{BS}$ producing the current $i_{bs}$, respectively, both shown in FIG. 1.

Figure 5:
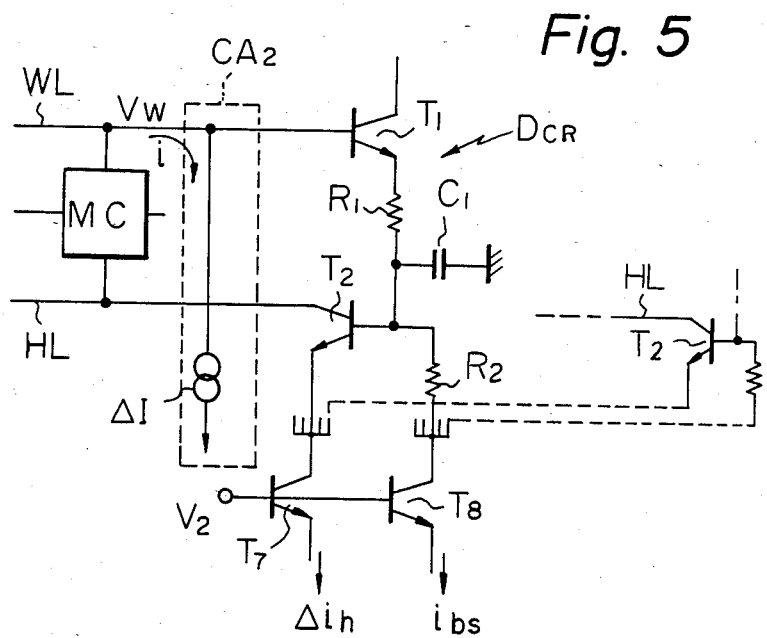
FIG. 5 is a circuit diagram of a part of the semiconductor memory circuit of FIG. 1 cooperating with a charge absorbing circuit according to a second embodiment of the present invention.

FIG. 5 is a circuit diagram of a part of the semiconductor memory circuit of FIG. 1 cooperating with a charge absorbing circuit according to a second embodiment of the present invention. The second embodiment is illustrated as a charge absorbing circuit $CA_2$ which utilizes a current source $\Delta I$. The current flowing through the source $\Delta I$ is not constant, but variable in accordance with the variation of the word line voltage $V_W$. Therefore, when the voltage $V_W$ rises along with the voltage increase of $\Delta V$, the current i, due to the traveling surplus charges, can immediately be absorbed by the source $\Delta I$. Thus, the voltage increase $\Delta V$ can be suppressed.

Figure 6:
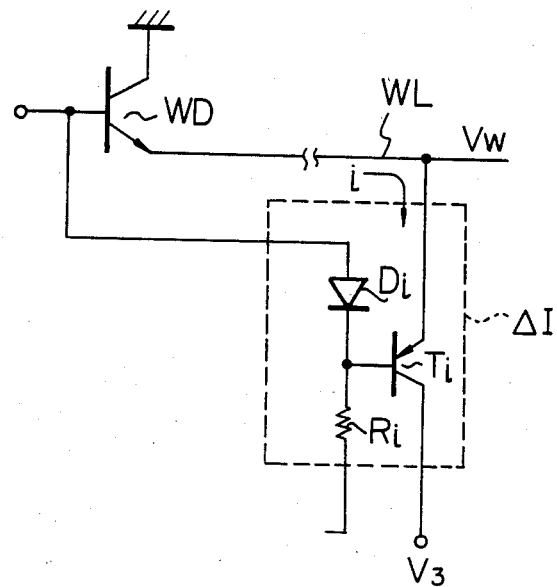
FIG. 6 is a detailed circuit diagram of one example of a current source $\Delta I$ shown in FIG. 5.

FIG. 6 is a detailed circuit diagram of one example of the current source $\Delta I$ shown in FIG. 5. The current source $\Delta I$ comprises at least a transistor $T_i$, a diode $D_i$, and a resistor $R_i$. The diode $D_i$ functions as a level shifter. In the case of the time t3 of FIG. 2(b) in the base voltage of the word driver WD is the low level and, accordingly, the base voltage of the transistor $T_i$ is the low level. On the other hand, the word line voltage $V_W$ rises with the voltage increase of $\Delta V$. Then, the transistor $T_i$ is fully turned on, so that the current i can be absorbed into a voltage source of $V_3$.

Figures 7A, 7B:
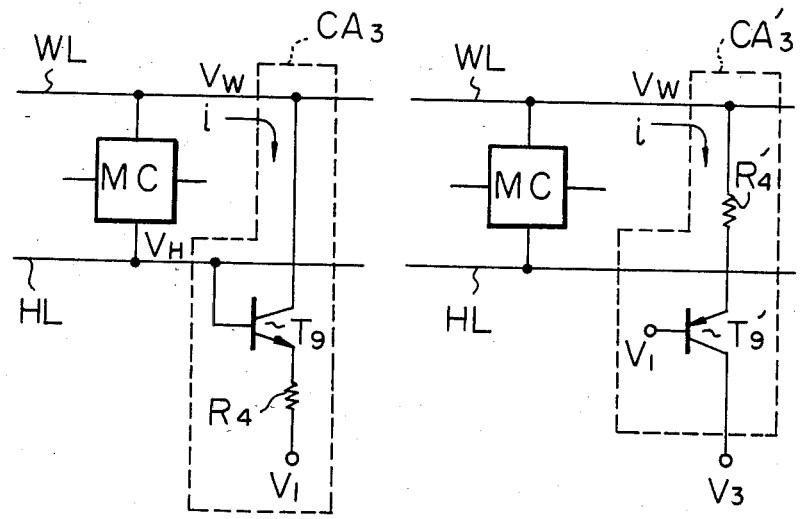
FIG. 7A is a circuit diagram of a part of the semiconductor memory circuit of FIG. 1 cooperating with a charge absorbing circuit according to a third embodiment of the present invention.
FIG. 7B is a circuit diagram of a modification of the charge absorbing circuit $CA_3$ in FIG. 7A.

FIG. 7A is a circuit diagram of a part of the semiconductor memory circuit of FIG. 1 cooperating with a charge absorbing circuit according to a third embodiment of the present invention. The third embodiment is illustrated as a charge absorbing circuit $CA_3$. Transistor $T_9$ of the npn type is connected at its collector to the word line WL and at its base to the hold line HL. The emitter thereof receives the first constant voltage $V_1$ via a fourth resistor $R_4$. Since, as previously mentioned, the hold line voltage $V_H$ increases along with the increase of the word line voltage $V_W$, the transistor $T_9$ is turned on when the voltage increase $\Delta V$ takes place. Thus, when the voltage $V_W$ is increased the current i can be absorbed toward the voltage source $V_1$ through the transistor $T_9$, which is now on.

FIG. 7B is a circuit diagram of a modification of the charge absorbing circuit $CA_3$ in FIG. 7A. The modified example is illustrated as a charge absorbing circuit $CA_3'$ comprised of a resistor $R_4'$ and a transistor $T_9'$ of the pnp type, opposite to that of the transistor $T_9$. The collector of the transistor $T_9'$ is a negative constant voltage source or a second constant voltage source of $V_3$, as is the transistor $T_i$ of FIG. 6. The emitter thereof is connected to the word line WL. The base thereof is not connected to the hold line HL, as in the circuit of FIG. 7A, but receives the first constant voltage $V_1$. If the word line voltage $V_W$ rises with the voltage increase $\Delta V$, the transistor $T_9'$ is turned on. Then the current i starts flowing through the transistor $T_9'$, now conductive.

Figure 8:
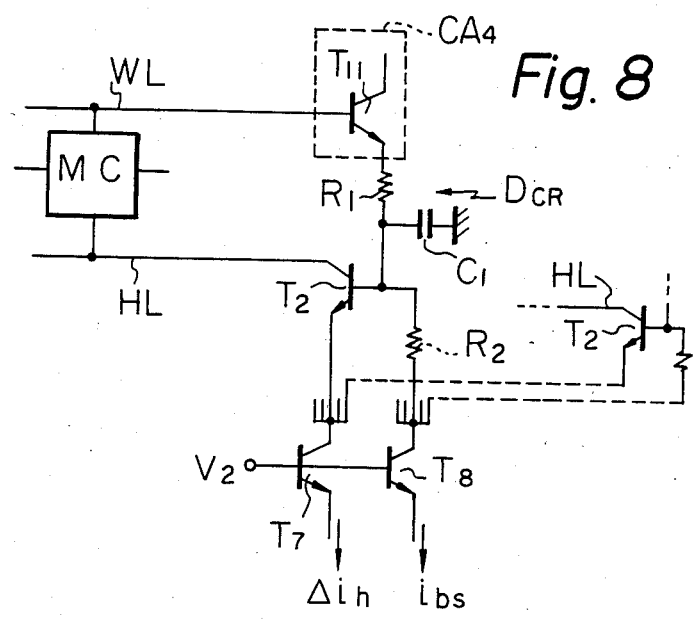
FIG. 8 is a circuit diagram of a part of the semiconductor memory circuit cooperating with a charge absorbing circuit according to a fourth embodiment of the present invention.

FIG. 8 is a circuit diagram of a part of the semiconductor memory circuit of FIG. 1 cooperating with a charge absorbing circuit according to a fourth embodiment of the present invention. The fourth embodiment utilizes a transistor $T_{11}$ having a low current amplification factor $\beta$ as a charge absorbing circuit. The base is connected to the word line WL, while the emitter may be connected to an appropriate current source. When the transistor is turned on, a relatively large base current flows from the word line WL to its emitter, because it has a low current amplification factor $\beta$. Therefore, the transistor has sufficient capability for absorbing the current i induced by the voltage increase $\Delta V$ from the word line, and, thereby, the charge absorbing circuit can be realized. In the fourth embodiment, such a charge absorbing circuit is referenced by the symbol $CA_4$ and is preferably constructed as common to the aforesaid first transistor $T_1$. In other words, a first transistor $T_{11}$ of low current amplification is used as both the first transistor $T_1$ and the charge absorbing circuit $CA_4$.

Such a low current amplification transistor can be fabricated in such a manner as to form a deep base diffusion region during the production process of the semiconductor memory device.

Figure 9:
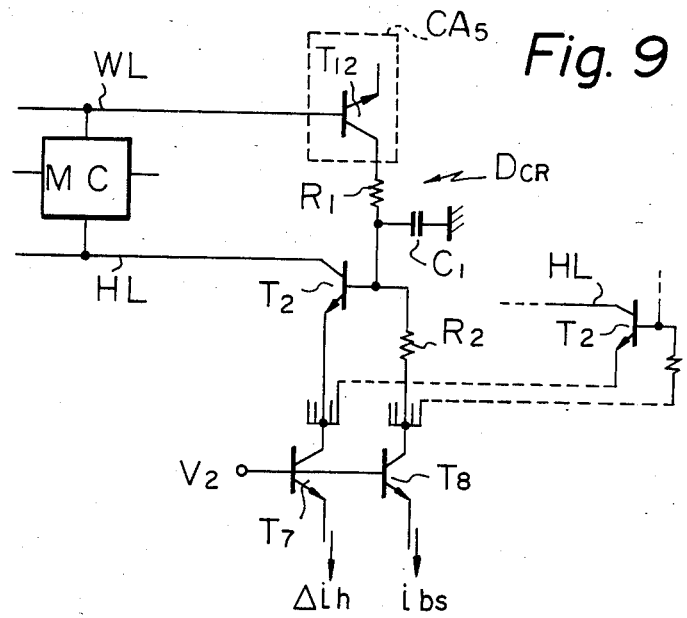
FIG. 9 is a circuit diagram of a part of the semiconductor memory circuit of FIG. 1 cooperating with a charge absorbing circuit according to a fifth embodiment of the present invention.

FIG. 9 is a circuit diagram of a part of the semiconductor memory circuit of FIG. 1 cooperating with a charge absorbing circuit according to a fifth embodiment of the present invention. The basic concept behind the fifth embodiment is the same as that of the above-mentioned fourth embodiment. The embodiments, however, differ in that a transistor corresponding to the first transistor $T_{11}$ of FIG. 8 is realized in the fifth embodiment by an inverse transistor. That is, in FIG. 9, the charge absorbing circuit $CA_5$ of the fifth embodiment comprises an inverse transistor $T_{12}$. The term "inverse transistor" means that a region which would usually act as an emitter is used inversely as a collector, and, similarly, a region which would usually act as a collector is used inversely as an emitter. Such an inversion between the emitter and collector is easily achieved merely by interchanging conductors during the production process of the semiconductor memory device. That is, a first conductor which would usually be connected to the emitter region is inversely connected to the collector region, and, similarly, a second conductor which would usually be connected to the collector region is inversely connected to the emitter region.

The reason why the inverse transistor $T_{12}$ provides a low current amplification factor $\beta$, as the transistor $T_{11}$ of FIG. 8, is that it has a lower efficiency of injection and a lower efficiency of collection. The lower injection efficiency is due to the fact that the inverse transistor can no longer function as a drift transistor. This is because an electric field, which is oriented opposite to that of the drift transistor, is applied to a transition path of electrons traveling from a usual collector region to a usual emitter. The lower collection efficiency is that electrons traveling from the usual collector region toward the usual emitter region partly leak into the base region, because the usual collector region has a wider area than the usual emitter region.

Thus, the transistor $T_{12}$ has sufficient capability for absorbing the current i induced by the voltage increase $\Delta V$ from the word line WL, and, thereby, the charge absorbing circuit $CA_5$ can be realized, which is preferably constructed as common to the first transistor $T_1$. In other words, a first transistor $T_{12}$ of low current amplification is used as both the first transistor $T_1$ and the charge absorbing circuit $CA_5$.

Reviewing again the first through fifth embodiments, the charge absorbing circuit of each embodiment absorbs not only the current i to be suppressed, but also a charge current to be supplied to the word line during the transition from the nonselection state to the selection state. It would be preferable to absorb only the current i selectively and not the charge current, because, the charge current itself must be drawn from the word line WL. If the charge current is unnecessarily drawn therefrom, it may cause increased power consumption in the device. However, it is important to know that such an increased power consumption is negligible, because the related charge current flows, at all times, into only the one selected word line, among the many word lines, from the selected word driver.

If necessary, however, it is possible to construct a charge absorbing circuit which does not absorb that charge current, but only the undesired current i. This, however, does complicate the construction of the charge absorbing circuit.

Figure 10:
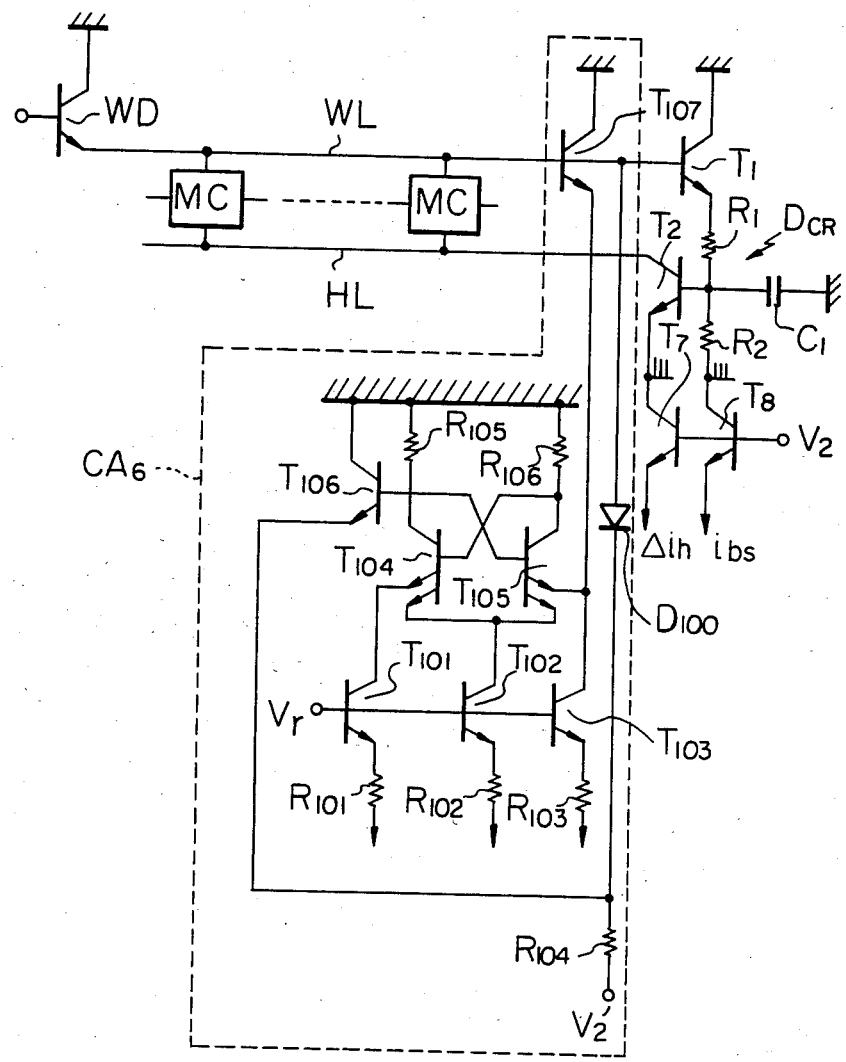
FIG. 10 is a circuit diagram of a part of the semiconductor memory circuit of FIG. 1 cooperating with a charge absorbing circuit according to a sixth embodiment of the present invention.

FIG. 10 is a circuit diagram of a part of the semiconductor memory circuit cooperating with a charge absorbing circuit according to a sixth embodiment of the present invention. The sixth embodiment is illustrated as a charge absorbing circuit $CA_6$ which can absorb the current i only. In FIG. 10, each pair of transistor and resistor, such as $T_{101}$–$R_{101}$, $T_{102}$–$R_{102}$, $T_{103}$–$R_{103}$, forms a constant current source. Symbol $V_r$ denotes a voltage for activating these constant current sources. Transistors $T_{104}$ and $T_{105}$, together with resistors $R_{105}$ and $R_{106}$, form a flip-flop. Symbol $V_2'$ denotes a voltage having substantially the same level as the second constant voltage $V_2$, but a slightly higher level than $V_2$ by the value of $V_F$, which is a forward voltage of a diode $D_{100}$. The transistor $T_{105}$ and a transistor $T_{107}$ form emitter-coupled transistors. The operation is as follows. During the selection state, the base voltage of the transistor $T_{107}$ becomes higher than that of the transistor $T_{105}$. Therefore, the transistor $T_{105}$ is turned off, while, inversely, the transistor $T_{104}$ is turned on, since they perform a flip-flop operation. The transistor $T_{106}$ is then turned on due to a voltage drop across the resistor $R_{105}$ induced by the conductive transistor $T_{104}$. A current produced by the conductive transistor $T_{106}$ flows toward the voltage source of $V_2'$ through a resistor $R_{104}$. This current creates a voltage drop across the resistor $R_{104}$, and, thereby, the voltage level at the upper end of the resistor $R_{104}$ becomes higher than the voltage level of $V_2'$ by the amount of the voltage drop. Thus, the diode $D_{100}$ is changed to a cut-off state, and, therefore, no current flows from the word line WL to the voltage source of $V_2'$. In conclusion, neither the aforesaid charge current nor the current i is drawn from the word line during the selection state.

Contrary to the above, during the nonselection state, the base voltage of the transistor $T_{107}$ becomes lower than that of the transistor $T_{105}$. Therefore, the transistor $T_{105}$ is turned on, while, inversely, the transistor $T_{104}$ is turned off, since they perform a flip-flop operation. Since the transistor $T_{104}$ is turned off, the transistor $T_{106}$ is turned off due to no voltage drop across the resistor $R_{105}$. Therefore, a current which would be produced by the conductive transistor $T_{106}$ stops flowing toward the voltage source of $V_2'$ through a resistor $R_{104}$. This stop in the current results in no voltage drop across the resistor $R_{104}$. Therefore, the voltage level at the upper end of the resistor $R_{104}$ becomes the same as the voltage level of $V_2'$. This means that the diode $D_{100}$ is not fully in the cut-off state, but is liable to change into the conductive state if a slight voltage is induced in the word line WL. Under such circumstances, if the voltage increase $\Delta V$ occurs in the word line WL, the diode $D_{100}$ is necessarily made conductive. Thus, the current i is absorbed by the voltage source of $V_2'$. In this embodiment, since the voltage level of $V_2'$ is preset to be higher than the voltage level of $V_2$ by the value of $V_F$, for example 400 mV, i.e., the diode $D_{100}$ is fully reverse biased, no current is drawn from the word line WL so long as the word line voltage is maintained at its nominal level, i.e., $V_2$. In conclusion, only the current i is drawn from the word line only during the nonselection state.

As mentioned above in detail, according to the present invention, neither the double selection nor the erroneous write current flow occur in the semiconductor memory circuit.

We claim:

1. A semiconductor memory circuit, comprising:
   a plurality of word lines;
   a plurility of hold lines;
   a plurality of pairs of bit lines;
   a plurality of saturation-type memory cells, each comprising cross-coupled PNPN circuits operatively connected to one of said pairs of bit lines and driven by a corresponding word line and a corresponding hold line;
   hold current sources for always passing a hold current through each hold line;
   a delay circuit operatively connected to one of said word lines and one of said hold lines;
   a common additional hold current source operatively connected to the delay circuit for passing an additional hold current through said corresponding hold line, during a transition from a selection state to a nonselection state and not passing the additional hold current through the corresponding hold line during a transition from the nonselection state to the selection state of said corresponding word line, in cooperation with said delay circuit; and
   a charge absorbing circuit for and operatively connected to each said corresponding word line, said charge absorbing circuit absorbing a current, induced by a voltage increase in said corresponding word line due to a surplus charge from one of said saturation-type memory cells, occurring soon after said corresponding word line is switched from the selection state to the nonselection state.

2. A semiconductor memory circuit as set forth in claim 1, wherein said word lines have a voltage level in the non-selection state, and wherein each said charge absorbing circuit comprises a resistor operatively connected at one end to said corresponding word line, while receiving, at the other end, a constant voltage which has a voltage level the same as the voltage level of said corresponding word line in the nonselection state.

3. A semiconductor memory circuit as set forth in claim 1, wherein each said charge absorbing circuit comprises a current source, operatively connected to said corresponding word line, for drawing the current from said corresponding word line at the time said voltage increase occurs in said corresponding word line, and the current flowing through the current source is variable in accordance with the variation of the word line voltage.

4. A semiconductor memory circuit as set forth in claim 1, wherein said word lines have a voltage level in a non-selection state, and wherein each said charge absorbing circuit comprises:
   a transistor of the npn type having a collector operatively connected to said corresponding word line, a base operatively connected to said corresponding hold line, and an emitter;
   a resistor operatively connected to the emitter of said transistor and a constant voltage which has a voltage level the same as the voltage level of said corresponding word line in the nonselection state.

5. A semiconductor memory circuit as set forth in claim 1, wherein each said charge absorbing circuit comprises a transistor of the pnp type having an emitter operatively connected to said corresponding word line, a base operatively connected to a first constant voltage which has a voltage level the same as the voltage level of said corresponding word line in the nonselection state, and a collector operatively connected to a second constant voltage.

6. A semiconductor memory circuit as set forth in claim 1,
   wherein each said charge absorbing circuit comprises:
      a current source; and
      a first transistor having a low current amplification factor, and having a base operatively connected to said corresponding word line and an emitter operatively connected to said current source, and
   wherein said delay circuit comprises:
      a time constant circuit operatively connected to the emitter of said first transistor and ground; and
      a second transistor having a source operatively connected to said corresponding hold line and an emitter operatively connected to said common additional hold current source through which the hold current flows from said hold line to said common additional hold current source, said second transistor having a base operatively connected to said time constant circuit and controlled by the output of said first transistor by means of said time constant circuit.

7. A semiconductor memory circuit as set forth in claim 1,
wherein each said charge absorbing circuit comprises:
- a current source; and
- an inverse transistor having a region which would usually act as an emitter used inversely as a collector, similarly, having a region which would usually act as a collector used inversely as an emitter, and having a base operatively connected to said corresponding word line, the emitter operatively connected to said current source, and wherein said delay circuit comprises:
- a time constant circuit operatively connected to the collector of said inverse transistor and ground; and
- a second transistor having a source operatively connected to said corresponding hold line and an emitter operatively connected to said common additional hold current source through which the hold current flows from said hold line to said common additional hold current source, said second transistor having a base operatively connected to said time constant circuit and controlled by the output of said first transistor by means of said time constant circuit.

8. A semiconductor memory circuit as set forth in claim 1, wherein each said charge absorbing circuit comprises:
- a diode having a cathode operatively connected to said corresponding word line;
- a resistor operatively connected to said diode and receiving a first constant voltage;
- a control circuit, operatively connected to a second constant voltage, ground and said resistor, for controlling current passing through said resistor; and
- a transistor having an emitter operatively connected to said control circuit, a base operatively connected to said corresponding word line, and a collector operatively connected to a power source.

* * * * *